United States Patent [19]

Fan

[11] 4,053,313

[45] Oct. 11, 1977

[54] PROCESS FOR IMAGE REPRODUCTION USING MULTILAYER PHOTOSENSITIVE SOLVENT PROCESSABLE ELEMENTS

[75] Inventor: Roxy N. Fan, East Brunswick, N.J.

[73] Assignee: E. I. Du Pont de Nemours and Company, Wilmington, Del.

[21] Appl. No.: 685,990

[22] Filed: May 13, 1976

Related U.S. Application Data

[63] Continuation-in-part of Ser. No. 583,454, June 3, 1975, abandoned.

[51] Int. Cl.$^2$ .............................................. G03C 5/00
[52] U.S. Cl. ...................................... 96/36; 96/35.1; 96/27 R

[58] Field of Search ..................... 96/75, 35.1, 67, 36, 96/27 R

[56] References Cited

U.S. PATENT DOCUMENTS

| | | | |
|---|---|---|---|
| 3,136,637 | 6/1964 | Larson | 96/75 |
| 3,241,973 | 3/1966 | Thomas | 96/115 P |
| 3,721,557 | 3/1973 | Inoue | 96/28 |
| 3,894,873 | 7/1975 | Kobayashi et al. | 96/33 |

Primary Examiner—John D. Welsh

[57] ABSTRACT

Image reproduction process utilizing an imagewise exposed photosensitive element comprising a solvent-processable photosensitive layer and a nonphotosensitive elastomeric tonable contiguous layer. Color proofs can be made by the process.

15 Claims, No Drawings

PROCESS FOR IMAGE REPRODUCTION USING MULTILAYER PHOTOSENSITIVE SOLVENT PROCESSABLE ELEMENTS

CROSS REFERENCE TO PRIOR APPLICATION

This is a continuation-in-part of application Ser. No. 583,454, filed June 3, 1975, abandoned.

BACKGROUND OF THE INVENTION

1. Field of the Invention

The invention relates to image reproduction processes. More particularly this invention relates to image reproduction processes utilizing photosensitive elements having a solvent-processable photosensitive layer and a tonable or solvent-soluble contiguous layer.

2. Description of the Prior Art

The prior art, e.g., Burg et al., U.S. Pat. Nos. 3,060,024 and 3,060,025; Celeste et al., U.S. Pat. No. 3,607,264; and Phlipot, U.S. Pat. No. 3,236,647, describes photopolymer elements and processes of use. Uncolored photopolymerizable layers are selectively colored by applying colorants to imagewise exposed clear photopolymerizable layers so that the pigment adheres selectively to the unexposed areas. Chu and Cohen, U.S. Pat. No. 3,649,268, describes a process in which an element having a removable support and a photohardenable layer is (1) laminated to a receptor layer and (2) imagewise exposed through the support to actinic radiation which selectively raises the stick temperature of those areas receiving the radiation, then (3) the support is stripped from the layers, and (4) the outer surface of the layer is treated (e.g., dusted) with a material, usually a colored pigment which adheres only to the unexposed areas of the layer thereby producing a positive image. By repeating the laminating, exposing with color separation records, stripping and treating steps in sequence, a multicolor image can be obtained. However, the process has the limitation of producing only a duplicate image (i.e., the pigment image is a duplicate of the image on the transparency used for exposure) and is therefore restricted in use, particularly where it is desired to produce a reverse image (i.e., an image which is complementary to the image on the transparency used for exposure).

Since the elements of the prior art generally produce toned images by adherence of toner to unexposed areas of a photopolymerizable layer they produce duplicate images. An element is needed which will produce reverse images and which will produce duplicate toned images of improved color density and toning temperature latitude for color proof and photomasks and in other areas where photopolymers are useful, e.g., color design work using custom colors.

SUMMARY OF THE INVENTION

In accordance with this invention there is provided an image reproduction process comprising: (1) exposing imagewise to actinic radiation a photosensitive element comprised of, in order (A) a solvent-processable photosensitive layer, (B) a nonphotosensitive tonable contiguous layer comprised of an elastomeric material, and (C) a sheet support, either the exposed or unexposed areas of said solvent-processable photosensitive layer being solvent-soluble after said imagewise exposure, (2) washing out either exposed or unexposed areas of said solvent-processable photosensitive layer while the other areas of said layer remain on said contiguous elastomeric layer, and (3) toning the areas of the contiguous elastomeric layer from which areas of the photosensitive layer were removed.

The process of the invention is capable of producing duplicate or reverse images as desired. Accordingly, with the element of the invention, a desired image may be produced by exposing, removing the cover sheet or layer if one is present, washing out areas of the photosensitive layer and then washing out or toning the contiguous elastomeric layer. The contiguous elastomeric layer provides a layer which can be washed out but which, alternatively, may be toned and has excellent tonability by particulate toner material and wide toning temperature latitude as well as good adhesion where the layer is laminated to a separate surface.

DETAILED DESCRIPTION OF THE INVENTION

The invention relates to the use of a versatile, multilayer, photosensitive element having improved adhesion between layers and to other surfaces and improved tonability with particular material. This improvement is obtained by employing elastomeric material as a contiguous layer in a multilayer element as described. The contiguous elastomeric material is nonphotosensitive and can produce a reverse image or a duplicate image depending upon which areas of the solvent-processable photosensitive layer remain on the contiguous layer after wash out.

The solvent-processable photosensitive layer is one which may be processed by wash out with a solvent after imagewise exposure to actinic radiation. Either the exposed or unexposed areas may be washed out, leaving the other areas remaining on the contiguous elastomeric layer. The solvent-processable photosensitive layer may be a photo-hardenable material, e.g., comprises of photopolymerizable, photocrosslinkable, or photodimerizable material which hardens and becomes insoluble in the exposed areas or it may be a photosolublizable photodensesitizable or photodepolymerizable material which becomes soluble in the exposed areas in insoluble in the unexposed areas. Whichever areas are insoluble after exposure, remain on the contiguous elastomeric layer and must be nontonable. In a particularly preferred embodiment, the photosensitive layer is photopolymerizable and upon exposure the exposed areas thereof become relatively insoluble in a solvent for the unexposed areas. The areas of the photosensitive layer remaining on the contiguous elastomeric layer after wash out may be nontonable under a condition under which the contiguous elastomeric layer is tonable so that the toner is accepted only by the contiguous elastomeric layer. This difference in tonability may be effected by an intermediate treatment if necessary, e.g., a thermal treatment or treatment with some reagent, etc. However, if the contiguous layer is to be developed by washing out the bared areas from which the solvent-processable layer is washed out, a difference in tonability is not required.

By "washing out" is meant the removal of material by using a solvent, which may include agitation in a bath of solvent, with the aid of mechanical action such as brushing or spraying. The insoluble property of the remaining areas of the solvent-processable layer and the soluble property of the contiguous layer may be due to their respective degrees of photohardening or degree of polymerization or to their respective degrees of absorptivity, hydrophilicity or reactivity with respect to the solvent.

Various solvents suitable for use are disclosed in the prior art. The particular solvent to be used will depend on the materials of which the photosensitive layer and the contiguous layer are composed and the method of use of the element (e.g., whether it is given an overall exposure to actinic radiation after stripping the cover sheet). Such hydrocarbon solvents as 1,1,1-trichloroethane, benzene, trichloroethylene, and hexane, for example, are known in the art for washing out areas of polymeric layers for image development. In the case of certain polymers, aqueous solutions, such as disclosed in U.S. Pat. No. 3,475,171, may be used.

Preferred materials for the solvent-processable photosensitive layer include the photohardenable materials with ethylenically unsaturated or benzophenone-type groups in which an increase in molecular weight is caused by exposure to actinic radiation. The well-known photohardenable materials which are comprised of an ethylenically unsaturated material which is photopolymerizable, photoscrosslinkable or photodimerizable are preferred. Such materials are described, for example, in U.S. Pat. No. 3,649,268. Also useful are the diazotized condensates with for example, phenol-formaldehyde resins as described in Kosar, Light Sensitive Systems, Wiley, Chapter 7, 1965. Additional useful compositions are those described in U.S. Pat. Nos. 3,782,951 and 3,888,672 and Belgian Pat. No. 542,566.

Particularly preferred are photopolymerizable compositions comprised of a macromolecular organic polymer binder and an addition polymerizable ethylenically unsaturated monomer. Such monomers have one or more terminal ethylenic groups capable of free radical initiated, chain propagated, addition polymerization. The photopolymerizable composition also contains a free radical generating addition polymerization photoinitiating system (i.e., at least one organic photoinotiator compound) activatable by actinic radiation, e.g., ultraviolet and visible radiation. Numerous monomers and polymeric binders for such compositions are described in the prior art such as U.S. Pat. Nos. 2,760,863; 3,380,831; and 3,573,918.

The solvent-processable layer may be comprised of materials which become soluble on exposure to actinic radiation but which are insoluble before exposure. Such materials include photosoluble compositions, e.g., polymers containing pendent o-quinone diazide groups as described in U.S. Pat. No. 3,837,860, and polymers mixed with bis-diazonium salt compositions, e.g., such as those described in U.S. Pat. No. 3,778,270 and the diazonium binder systems described in Kosar, Light Sensitive Systems, Wiley, Chapter 7, 1965 and photodepolymerizable compositions described in U.S. Ser. No. 545,603.

A strippable cover sheet may be employed on the element of the invention. It must be strippable (i.e., removable by peeling it apart) from the rest of the element. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. While the thickness of the cover sheet may be varied over a wide range, films having a thickness of 0.001 inch (0.025 mm) or less are particularly preferred. This cover sheets produce halftone dots of good roundness with sharp edges. In addition a tonal range of 2%-98% dot resolution (using a halftone screen with 150 lines/inch, 59.06 lines/cm) is obtainable with thin cover films. By "tonal range" is meant the range of sizes of resolvable halftone dots as a percentage of a maximum dot size. Instead of a strippable cover sheet a removable (e.g., solvent-soluble) layer may be employed (see U.S. Pat. No. 3,458,311). The cover sheet should be thick enough so that it may be stripped without tearing. The cover sheet may additionally comprise auxiliary treatments or layers to improve adhesion, strength, and other properties.

The contiguous elastomeric layer is comprised of elastomeric polymers and mixtures thereof having a second order transition temperature of $-10°$ C. or lower which are solvent-soluble or inherently tacky or will accept tackifying agents, and are preferably non-migratory into said solvent-processable layer, and will impart tackiness to the layer. Rubber type polymers, both natural and synthetic may be used, e.g., isobutylene, Thiokol A, nitrile rubbers, butyl rubber, chlorinated rubbers, polymers of butadiene, poly(vinylisobutylether), isoprene and random, teleblock and block copolymers, terpolymers or higher polymers, e.g., butadiene copolymerized with styrene, isoprene and neoprene, silicone elastomers, acrylic containing elastomers, etc. in various proporations. With these materials, a stable adhesion balance between the solvent-processable layer and a support for the contiguous layer, in a preferred element, may be achieved for elements useful in making color proofs by the overlay method or by the surprint method. Such elastomeric materials are soluble in hydrocarbon solvents such as hexane. These elastomeric materials are also preferred for their tackiness which provides good adhesion to the solvent-processable layer, excellent acceptance of toner, wide toning temperature latitude, and good adhesion to substrates where the element is laminated to a substrate. This tackiness can also be further improved by the addition of tackifiers such as those described in Skeist, *Handbook of Adhesives*, Ch. 14, Reinhold Publishing Corp., 1962. Such tackifiers may comprise a polyterpene resin, a coumarone-indene resin, stabilized glycerol esters of abietic acid resin, stabilized acid wood rosin, a β-pinene polymer, and a cycloaliphatic resin. Particularly useful are the highly stabilized glycerol ester of abietic acid resin and low molecular weight cycloaliphatic hydrocarbon resins, both types having a softening point of about 85° C. The tackifier apparently associates with the rubber network of the elastomer and expands the volume fraction of the rubber phase, which tends to reduce stiffness and provides aggressive tackiness. Colorants, i.e., dyes or pigments, can be incorporated in the coating composition for the contiguous layer.

Any suitable solvent may be used to coat the contiguous layer as long as it does not cause migration of components of the layer into the photosensitive layer when the two layers are coated simultaneously. The coating weight of the contiguous layer may be varied over a wide range, but generally a coating weight of about 40mg/dm$^2$ (generally providing a dry thickness of about 0.00015 inch, 0.038mm) wil be satisfactory. The contiguous layer may also be coated as a dispersion, e.g., an aqueous dispersion with satisfactory results. In a preferred embodiment, the element has a support for the contiguous layer. The support may be any suitable film which has the necessary characteristics for the proper adhesion to the contiguous layer depending upon how the element is to be used, i.e., for surprint color proofing or overlay color proofing or other photomechanical processes such as making photomasks, litho negatives, etc. For color proofing by the overlay method, for example, photographic grade polyethylene terephthalate films which may or may not contain an anchoring layer such as those disclosed in U.S. Pat. No. 2,779,684 may be used. Similar films may or may not have a releasable coating, e.g., a silicone coating, may also be used. A thermoplastic layer may also be used which allows the support to be easily stripped from the contiguous layer yet holds the support and contiguous layer together when heat laminated or delaminated. In the case where a thermoplastic coating is used, the stripping operation leaves the thermoplastic layer attached to the contiguous layer. A release film that does not require any special treatment is obviously the most convenient.

The solvent-processable layer may also contain other ingredients including plasticizers, antihalation agents colorants and optical brightening agents. By the incorporation of optical brightening agents in the photosensitive layer, the image record is produced free from distortion due to halation effects and free from discoloration due to element components. Suitable optical brighteners can be found in U.S. Pat. No. 2,784,183 and 3,644,394. Specific compounds which are particularly useful in the photopolymerizable layers of this invention are 2-(stilbyl-4")-(naphtho-1',2':4,5)-1,2,3-triazol-2"-sulfonic acid phenyl ester hereinafter designated as Brightener I and 7-(4'-chloro-6'-diethylamino-1',3',5'-triazine-4'-yl) amino-3-phenyl-coumarin hereinafter designated as Brightener II. These compounds are useful in preparing sharp, bright, multicolor images with clean white backgrounds on toning with colorants as shown in U.S. Pat. No. 3,854,950.

As indicated above, either or both the solvent-processable photosensitive layer and contiguous layer can have incorporated therein transparent dye colorants or pigment type colorants depending on the manner in which the element is to be used. By incorporating a colorant in the photosensitive layer, there is provided a visual aid for inspecting the image areas after solvent processing. By incorporating the proper transparent dyes in the solvent-processable photosensitive layers and/or contiguous layers, color proofs may be construed in an easy and simple manner. Also visual aid slides can be constructed by incorporating either type of colorant in the solvent-processable photosensitive layer.

While the coating weight of the solvent-processable composition may be varied, it has been found that a preferred range from 5-1500 mg/dm² (providing a dry layer thickness of about 0.000015-0.005 inch, ~0.0004-0.125mm) will give good image quality and tonal range.

EXAMPLES OF THE INVENTION

The following examples illustrate the invention.

EXAMPLE 1

A positive-working color proof of the overlay type is made in the following manner:

I. Photopolymerizable Coating Composition

A coating composition is prepared by mixing together the following ingredients.

| | |
|---|---|
| Poly(methyl methacrylate/methacrylic acid)(90/10) | 75.0 g. |
| Polyethylene glycol dimethacrylate | 57.5 g. |
| (2-o-Chlorophenyl-4,5-diphenyl imidazolyl) dimer | 3.0 g. |
| Brightener I (described above) | 0.79 g. |
| Brightener II (described above) | 3.55 g. |
| 2,2'-Dihydroxy-4-methoxybenzophenone | 0.32 g. |
| 2,-Mercaptobenzothiazole | 2.0 g. |
| Methyl alcohol | 77.5 g. |
| Methylene chloride | 870.0 g. |

The resulting composition is coated on 0.0005 inch (0.013mm) thick polyethylene terephthalate film at a coating weight of about 43 mg/dm² and is allowed to dry.

II. Tonable Tacky Elastomer Layer

A coating composition is made in the following manner:

| | |
|---|---|
| Cis-polybutadiene | 360.0 g. |
| Random copolymer of styrene/butadiene | 240.0 g. |
| Tetra bis[methylene-3-(3',5'-di-t-butyl-4-hydroxyphenyl) propionate] methane | 3.0 g. |
| Methylene chloride | 5400.0 g. |

The resulting solution is coated on a 0.001 inch (0.025mm) thick polyethylene terephthalate film having a coating of a releasable layer of dimethyl siloxane. The coating weight of the tacky layer is about 120 mg/dm².

III. Laminating Procedure

The two elements I and II are laminated in surface to surface relationship at a temperature of 49° C. and a pressure of 40 pounds per square inch (2.81 kg/sqcm).

IV. Operations for Constructing An Overlay Color-Proof

An element from step III is stripped from the siloxane coated 0.001 inch (0.025mm) thick polyethylene tetraphthalate film and is laminated to a 0.0025 inch (0.064mm) thick polyethylene terephthalate film. The resulting film is exposed through a positive transparency, (halftone dot comparator target and a3√2 density step wedge) and through the 0.0005 inch (0.013mm) thick polyethylene terephthalate film side of the element using an exposing device identified as a nuArc Plate Maker (Flip-Top Model FT 266) at 220 volts using a pulsed xenon lamp at 17 amperes for 16 seconds. The 0.0005 inch (0.013mm) film is stripped off and the exposed photopolymerizable layer is developed by immersion for 30 seconds at 20° C. in a developer of the following composition:

| | | |
|---|---|---|
| Deionized water | 750 | ml. |
| Butyl cellosolve | 60 | ml. |
| Octyl phenoxy polyethoxy (9 or 10) ethanol (10% H₂O solution) | 2 | ml. |
| | 2 | ml. |
| Sodium silicate (37.60% solid) | 66.5 | g. |
| Deionized water to make | 1.0 | liter |

The element is rinsed with tap water for 1 minute, blotted, dry and blown with dry hot air. During the development step, the unexposed photopolymerizable layer is dissolved away, and the elastomeric tacky tonable layer is uncovered and reveals a positive working image which can be toned with a pigment toner to give the desired color. An overlay color proof can be made by carrying out the above operations with the proper colors to give a high quality colorproof.

A high quality surprint color print is made by transferring the photopolymerizable element to a 0.004 inch (0.10mm) thick polyethylene tetrephthalate film which contains a white pigment to provide an opaque white background.

The first film laminated to the opaque film support is the yellow printer which is toned with a yellow pigment. Next in order, there is laminated and exposed in register and developed a magneta printer which is toned to give the magenta image. The lamination, exposure and development is carried out with the cyan and black images to give a high quality positive color proof.

EXAMPLE 2

A printed circuit is made on a copper-clad epoxy board in the following manner:

Example I, steps I to III, were repeated forming a laminate element. To construct a printed circuit the element of Step III is stripped from the siloxane coated polyethylene terephthalate film and the tacky elastomer layer surface of the element is laminated at room temperature and a pressure of about 40 pounds per square inch (2.81 kg/sqcm) to the surface of a copper-clad epoxy board which is conventionally used in the preparation of printed circuits. The copper surface has been degreased and cleaned as is known in the art. The resulting element is exposed through a transparency of the desired printed circuit through the clear film contiguous with the photopolymerizable layer. The 0.0005 inch (0.013mm) clear film cover sheet is then stripped off. The exposed photopolymerized layer is developed by immersion for 30 seconds at 20° C. in the developer of Example 1. The element is rinsed with tap water for 1 minute, is blotted dry and blown with dry hot air. During the development step, the unexposed photopolymerizable layer dissolves away and the elastometric layer is uncovered. The copper-clad board with the circuit diagram covered by the elastomer layer, the elastomer layer in turn being covered by the exposed photopolymerizable layer, is immersed in a hexane solution which only dissolved the bared uncovered elastomer layer leaving the desired copper circuit covered by the elastomer layer and exposed photopolymerizable layer which acts as a resist. The circuit board is immersed in a conventional ferric chloride etching solution to remove the unwanted copper layer. The remaining photopolymer layer and underlying tacky layer is then removed by methylene chloride to give a good quality printed circuit.

This process is useful in arranging the exposure of a transparency in such a manner that the desired conductive pattern can be formed by plating, chemical milling or other methods of modifications as taught by U.S. Pat. No. 3,469,982.

For example, the etchable metal surface may be magnesium, zinc, copper, alloy of such metals, aluminum, anodized and dyed anodized aluminum, steel alloys, berylliumcopper alloy, etc.

The described structure is unique because it provides instant adhesion at room temperature to the surface of which it is laminated.

EXAMPLE 3

A negative working color proofing material is made in the following manner:

I. Photopolymerizable Composition (Nebe)

| | |
|---|---|
| Poly(methyl methacrylate/acrylic acid)(90/10) | 52.71 g. |
| Trimethylolpropane triacrylate | 36.61 g. |
| Triethylene glycol diacetate | 5.23 g. |
| Benzoin methyl ether | 2.5 g. |
| Nitrosocyclohexane dimer (Bluhm and Weinstein, Nature Vol. 215, page 1478, 1967) dissolved in 900 ml. methylene chloriide | 3.0 g. |

The resulting solution is coated on a 0.0005 inch (0.013mm) thick polyethylene terephthalate film and dried.

II. Tonable Elastomeric Layer

This layer is made and coated according to Step II of Example 1 above.

III. Laminating Procedure

The two elements I and II are laminated in surface to surface relationship at a temperature of 49° C. and a pressure of 40 pounds per square inch (2.81 kg/sqcm).

IV. Operations for Constructing an Overlay Color-Proof

An element from step III is stripped from the siloxane coated 0.001 (0.0254mm) inch thick polyethylene terephthalate film and laminated to a 0.0025 inch (0.0064mm) clear polyethylene terephthalate film. The resulting film is exposed through a cellulose acetate process transparency the full spectrum of a 100 watt high pressure mercury resonance lamp for 4 minutes, the transparency is removed and the film is exposed for 6 minutes to radiation limited to wavelengths greater than 3400 A (Corning 0–52 filter) the image exposed areas of the film is developed by washout with water followed by a solution of 40 grams of Borax and 500 grams of 2-ethoxyethanol in 4 liters of water. The bared tacky elastomeric positive image is toned as described in Example 1. The process is repeated with the desired colors to form an overlay color-proof film.

What is claimed is:

1. An image reproduction process comprising: (1) exposing imagewise to actinic radiation a photosensitive element comprised of, in order, (A) a solvent-processable photosensitive layer, (B) a nonphotasenitine tonable contiguous layer comprised of an elastomeric material, and (C) a sheet support, either the exposed or unexposed areas of said solvent-processable photosensitive layer being solvent-soluble after said imagewise exposure, (2) washing out either exposed or unexposed areas of said solvent-processable photosenstive layer while the other areas of said layer remain on said contiguous elastomeric layer, and (3) toning the areas of the contiguous elastomeric layer from which areas of the photosensitive layer were removed.

2. A process of claim 1 having a removable cover sheet or layer on said solvent-processable photosensitive layer.

3. A process of claim 1 wherein said solvent-processable photosensitive layer is comprised on an ethylenically unsaturated photohardenable material selected from photopolymerizable, photocrosslinkable, and photodimerizable compositions.

4. A process of claim 1 wherein said solvent-processable photosensitive layer is a photosoluble composition.

5. A process of claim 1 wherein said elastomeric layer has a glass transition temperature of −10° C. or lower.

6. A process of claim 5 wherein the elastometric layer is a butadiene polymer or copolymer.

7. A process of claim 1 wherein the unexposed areas of said solvent-processable photosensitive layer are washed out and the exposed areas remain on said contiguous elastomeric layer.

8. A process of claim 1 wherein the exposed areas of said solvent-processable photosensitive layer are washed out and the unexposed areas remain on said contiguous elastometric layer.

9. A process of claim 1 wherein said contiguous elastomeric layer contains a colorant.

10. A process of claim 1 wherein said solvent-processable photosensitive layer is colored.

11. A process of claim 1 wherein said contiguous elastomeric layer is toned with particulate material.

12. A process for producing an image from a photosensitive element comprising, in order from bottom to top, (A) a sheet support, (B) a tonable contiguous layer comprised of an elastomeric material, (C) a solvent-processable photosensitive layer, and (D) a removable cover sheet or layer, comprising:
 1. removing said sheet support from said element,
 2. laminating the surface of said contiguous layer of said element to a substrate, in either order,
 3. exposing said laminated photosensitive element imagewise to actinic radiation, either the exposed or unexposed areas of said solvent-processable photosensitive layer being solvent-soluble and
 4. removing said cover sheet, then
 5. washing out either exposed or unexposed areas of said solvent-processable photosensitive layer while the other areas of said layer remain on said contiguous elastomeric layer, and
 6. toning the areas of the contiguous elastomeric layer from which areas of the photosensitive layer were removed.

13. A process according to claim 12 wherein said element has a releasable layer interposed between said sheet support and said tonable contiguous layer.

14. A process according to claim 12 whereby a multilayer, image-bearing element is formed which comprises repeating said process steps (1) through (6) at least one, each succeeding element having its tonable layer in surface to surface contact with the image-bearing surface of the last previously laminated element.

15. A process according to claim 12 wherein the cover sheet is removed before imagewise exposing the laminated element to actinic radiation.

* * * * *

UNITED STATES PATENT OFFICE
CERTIFICATE OF CORRECTION

PATENT NO. : 4,053,313
DATED : October 11, 1977
INVENTOR(S) : Roxy N. Fan

It is certified that error appears in the above-identified patent and that said Letters Patent are hereby corrected as shown below:

| Patent Column | Line | Corrections |
|---|---|---|
| 8 | 46 | "nonphotasenitine" should be -- nonphotosensitive --. |
| 10 | 19 | "one" should be -- once --. |

Signed and Sealed this

Twentieth Day of June 1978

[SEAL]

Attest:

RUTH C. MASON
Attesting Officer

DONALD W. BANNER
Commissioner of Patents and Trademarks

REEXAMINATION CERTIFICATE (776th)
United States Patent [19]
Fan

[11] B1 4,053,313
[45] Certificate Issued Nov. 3, 1987

[54] PROCESS FOR IMAGE REPRODUCTION USING MULTILAYER PHOTOSENSITIVE SOLVENT PROCESSABLE ELEMENTS

[75] Inventor: Roxy N. Fan, East Brunswick, N.J.

[73] Assignee: E. I. Du Pont de Nemours and Company, Wilmington, Del.

Reexamination Request:
No. 90/001,190, Mar. 19, 1987

Reexamination Certificate for:
Patent No.: 4,053,313
Issued: Oct. 11, 1977
Appl. No.: 685,990
Filed: May 13, 1976

Certificate of Correction issued Jun. 20, 1978.

Related U.S. Application Data

[63] Continuation-in-part of Ser. No. 583,454, Jun. 3, 1975, abandoned.

[51] Int. Cl.$^4$ ............................................. G03C 5/00
[52] U.S. Cl. ................................... 430/270; 430/292; 430/293
[58] Field of Search ........................ 430/270, 293, 292

[56] References Cited

U.S. PATENT DOCUMENTS

| | | | |
|---|---|---|---|
| 2,403,225 | 7/1946 | Law | 49/79 |
| 2,993,788 | 7/1961 | Straw et al. | 96/13 |
| 3,036,913 | 5/1962 | Burg | 96/67 |
| 3,173,787 | 3/1965 | Clement et al. | 96/35 |
| 3,241,973 | 3/1966 | Thommes | 96/115 |
| 3,271,149 | 9/1966 | Starck et al. | 96/35 |
| 3,380,825 | 4/1968 | Webers | 96/35.1 |
| 3,527,605 | 9/1970 | Fisch et al. | 96/87 |
| 3,585,037 | 6/1971 | Gallois et al. | 96/83 |
| 3,649,268 | 3/1972 | Chu et al. | 96/27 R |
| 3,661,576 | 5/1972 | Crary | 96/35.1 |
| 3,677,757 | 7/1972 | Nishizawa | 96/36.1 |
| 3,711,284 | 1/1973 | van Paesschen et al. | 96/87 R |
| 3,725,109 | 4/1973 | Schulz et al. | 117/47 A |
| 3,753,715 | 8/1973 | Klupfel et al. | 96/86 P |
| 3,754,920 | 8/1973 | Kuchta | 96/87 R |
| 3,772,011 | 11/1973 | Guevara et al. | 96/1 R |
| 3,775,152 | 11/1973 | Jacoby et al. | 117/34 |
| 3,778,272 | 12/1973 | Hepher | 96/87 R |
| 3,788,856 | 1/1974 | van Paesschen et al. | 96/87 R |
| 3,867,153 | 2/1975 | MacLachlan | 96/79 |
| 3,895,946 | 7/1975 | Kubotera et al. | 96/33 |
| 3,909,265 | 9/1975 | Miyano et al. | 96/33 |
| 3,934,057 | 1/1976 | Moreau et al. | 427/43 |

*Primary Examiner*—John D. Welsh

[57] ABSTRACT

Image reproduction process utilizing an imagewise exposed photosensitive element comprising a solvent-processable photosensitive layer and a nonphotosensitive elastomeric tonable contiguous layer. Color proofs can be made by the process.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-15 is confirmed.

* * * * *